United States Patent [19]

Imazeki et al.

[11] 4,447,887

[45] May 8, 1984

[54] METHOD OF REWRITING DATA IN NON-VOLATILE MEMORY, AND SYSTEM THEREFOR

[75] Inventors: Ryoji Imazeki, Hachioji; Michiya Inoue, Hino, both of Japan

[73] Assignee: Fujitsu Fanuc Limited, Tokyo, Japan

[21] Appl. No.: 183,037

[22] Filed: Sep. 2, 1980

[51] Int. Cl.³ .............................................. G06F 11/00
[52] U.S. Cl. ......................................... 364/900; 365/1
[58] Field of Search ... 364/200 MS File, 900 MS File; 365/15, 1

[56] References Cited

U.S. PATENT DOCUMENTS 4,237,544 12/1980 Bonyhard .......................... 364/900

OTHER PUBLICATIONS

IBM Technical Disclosure Bulletin "Multilevel Staging Memory Control to Prevent Data Loss" by R. J. Mayka, vol. 20, No. 3, Aug. 1977 pp. 927–930.
Institute of Electrical and Electronics Engineers "Roll Back Point Insertion Strategies" by F. J. O'Brien pp. 138–147.

Primary Examiner—Eddie P. Chan
Assistant Examiner—John G. Mills
Attorney, Agent, or Firm—Staas & Halsey

[57] ABSTRACT

A method and system for rewriting data in a non-volatile memory in which the rewriting of one access unit of stored data is executed by erase and write cycles, the stored data being protected in the event of an interruption in electric power. In rewriting into second data the first data which is stored in a data storage area of the non-volatile memory, either the first or the second data is stored in a save area of the non-volatile memory, after which the first data in the data storage area is erased, followed by the writing of the second data in the data storage region to complete the rewrite operation.

2 Claims, 3 Drawing Figures

METHOD OF REWRITING DATA IN NON-VOLATILE MEMORY, AND SYSTEM THEREFOR

BACKGROUND OF THE INVENTION

This invention relates to a method and system for rewriting data in a non-volatile memory, and more particularly to a method and system for rewriting data in a non-volatile memory of the type in which rewriting of one access unit of stored data is executed by erase and write cycles, the method and system representing an improvement wherein data is protected in the event of an interruption in power.

The prior art includes a number of non-volatile memories of the type in which the rewriting of one access unit of stored data is executed by an erase cycle and write cycle. One example of such is a magnetic bubble memory having a major-minor loop organization. Means for dealing with an interruption in power is an important problem in non-volatile memories of the magnetic bubble memory type. In such memories the rewriting of stored data is executed in the following sequence. First, the data which is to be rewritten (referred to hereinafter as "old" data) is read out from the memory. Next, new data for rewriting is formed by editing the read-out data into new data, after which the read-out data is erased from the memory (the erase cycle). Following the erase cycle the new data is written in the memory, this step constituting the write cycle. In memories which require a rewrite sequence of this type, there is the danger that the new data will be erased if an interruption in power should occur during the erase cycle or in the interval of time between the completion of the erase cycle and the completion of the rewrite cycle. For example, though there will be no problems if the memory for the editing operation has a non-volatile construction, data will be lost or mutilated in the event of an interruption in power if the memory is volatile. If the rewrite operation is completed in a very short period of time, as with a semiconductor memory, a battery or the like can be used to supply power to the memory following an interruption in power, so that the data stored in the memory can be protected from erasure easily and at a comparatively low cost. Thus, no particular consideration need be given to a power interruption in such an arrangement. With a memory such as the magnetic bubble memory, however, where the erase and write cycles are long intervals, it is difficult to continue supplying the memory with power for the extended period of time which is required for the completion of the rewrite operation. In general, such a countermeasure would be expensive even if possible.

Accordingly, there is a need for an inexpensive method and system which enable the protection of data during an interruption in power in a non-volatile memory of the type described above.

BRIEF SUMMARY OF THE INVENTION

The present invention discloses a method and system for the rewriting of data in a non-volatile memory, by which it is possible to effect the protection of data inexpensively at the time of an interruption in power in a non-volatile memory of the type in which the rewriting of one access unit of stored data is executed by erase and write cycles.

Accordingly, it is an object of the present invention to provide a method and system for the rewriting of data in a non-volatile memory, by which the reliability of a data write operation can be assured even if a power interruption occurs after an erase cycle in a non-volatile memory of the type described.

It is another object of the present invention to provide a method and system for the rewriting of data in a non-volatile memory, by which data for rewriting can be readily obtained when power is restored following an interruption in a non-volatile memory fo the type described.

It is still another object of the present invention to provide a method and system for the rewriting of data in a non-volatile memory, by which data can be protected inexpensively even if there is an interruption in power following an erase cycle in a non-volatile memory of the type described.

It is a further object of the present invention to provide a method and system for the rewriting of data in a non-volatile memory, by which an address indicating the location whose contents disappeared, can be readily retrieved when power is restored following an interruption after the completion of an erase cycle in a non-volatile memory of the type described.

Other features and advantages of the invention will be apparent from the following description taken in connection with the accompanying drawings.

DESCRIPTION OF THE PREFERRED EMBODIMENT

Figure 1:
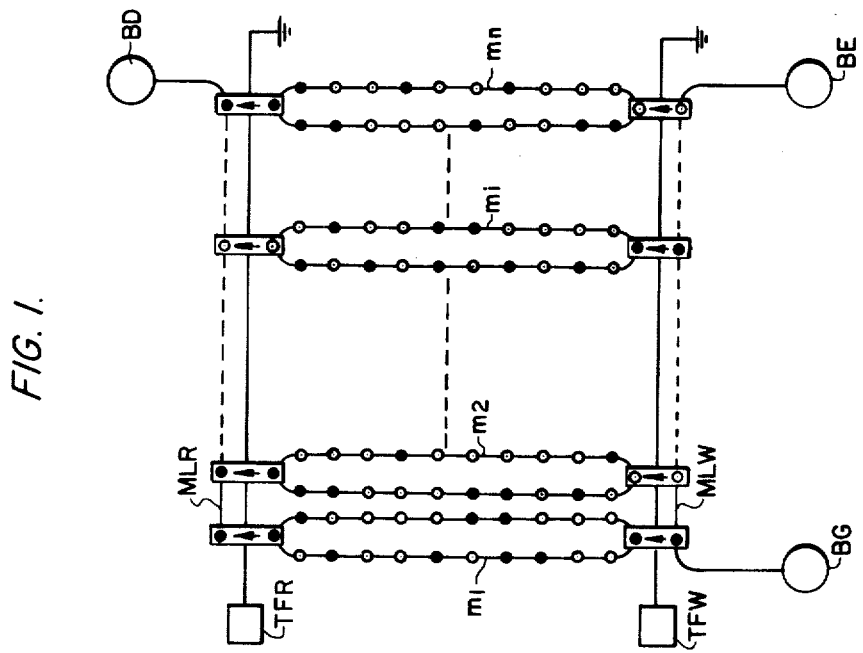
FIG. 1 is an illustrative view which is useful in describing the reading and rewriting of information in connection with a magnetic bubble memory having a major-minor loop organization, as an example to which the present invention is applied.

Before describing the present invention, reference will first be had to FIG. 1 for a description of a magnetic bubble memory which is one example of a non-volatile memory to which the present invention is applied. Specifically, the magnetic bubble memory has a major-minor loop organization, and the operations to be described will be the reading and rewriting of information in connection with the bubble memory.

In FIG. 1, $m_1$, $m_2$, $m_3$, . . . , $m_N$ denote minor loops which are a total of N in number. Each minor loop is a closed loop formed by a bubble domain transfer track of 2M bits. The loops may, for example, consist of a series of T bar patterns. BG denotes a bubble generator, BE a bubble eraser, MLR a read-only major line, and MLW a write-only major line. The minor loops $m_1$, $m_2$, . . . , $m_N$ are connected between the major lines MLR, MLW and include bubble domains which are shown by the black circles in the drawing. When a transfer instruction is provided by a transfer site TFR, those bubble domains at bit positions in the minor loops $m_1$, $m_2$ . . . , $m_N$ that are in the transfer area of the read-only major line MLR at that instant are transferred to the major line MLR. On the other hand, when a transfer instruction is provided by a transfer site TFW, those bubble domains, which are also shown by the black circles in the drawing, that have been written in the write-only major line MLW are transferred to the minor loops $m_1, m_2, \ldots, m_N$ at the areas where the minor loops contact the major line MLW.

The read and rewrite processes take place as follows. In reading one access unit of stored information comprising N bits, bubble domains at prescribed bit positions in the N-number of minor loops $m_1, m_2, \ldots, m_N$ are transferred in parallel to the read-only major line MLR in response to a transfer instruction. In the magnetic bubble memory of FIG. 1, if we let the 2M-bit information stored in each minor loop $m_i$ (where $i=1, 2, \ldots, N$) be expressed by $b(i, 1), b(i, 2), \ldots, b(i, 2M-1), b(i, 2M)$, then one access unit of stored information will be taken to mean N-bit information comprising the bits expressed by $\{b(1, j), b(2, j), \ldots, b(N, j)\}$, where $j=1, 2, \ldots, 2M$. This one access unit of stored information is generally referred to as a page.

The bubble domains which have been transferred to the read-only major line MLR are shifted successively bit-by-bit to provide an output of serial data. Accordingly, if a bubble detector BD (e.g., one which relies upon magneto-resistance) is provided at the exit of the read-only major line MLR, the output information may be read by sensing the absence or presence of the bubble domains. It should be noted that, in a read operation, destructive read and nondestructive read operations can be carried out wherein one access unit of the bubble domains in the minor loops $m_1, m_2, \ldots, m_N$ is either destroyed (in a destructive read) or preserved (in a nondestructive read), although it is customary for the information to be read in a nondestructive manner.

In rewriting information, however, one desired access unit of information in the minor loops $m_1, m_2, \ldots, m_N$ is erased by a destructive read operation as the first step. Since each of the minor loops comprises 2M bits, there are M bits arrayed between the read-only major line MLR and the write-only major line MLW, and the bubble domains in each minor loop will make exactly one revolution when the applied rotating field makes 2M revolutions. On the other hand, stored information in the minor loops that was in the transfer area of the read-only major line MLR arrives at the transfer area of the write-only major line MLW when the rotating field makes M revolutions. Accordingly, N-bit information which has been prepared beforehand at the write-only major line MLW is transferred in parallel to the respective minor loops $m_1$ through $m_N$ in response to a transfer instruction from the transfer site TFW after the rotating field has made M revolutions following the destructive read operation at the transfer site TFR. In this way new information is written in the bit positions (now all "0s") as cleared or destroyed by the destructive read operation. The writing of the new information is the write cycle mentioned above and completes the rewrite process.

It should be obvious from the foregoing discussion that a long period of time, equivalent to M revolutions or cycles of the rotating field between the completion of the erase cycle and the completion of the write cycle, is required in the reading and rewriting of each N-bit access unit, in the case of a magnetic bubble memory of the major-minor organization.

Figure 3:
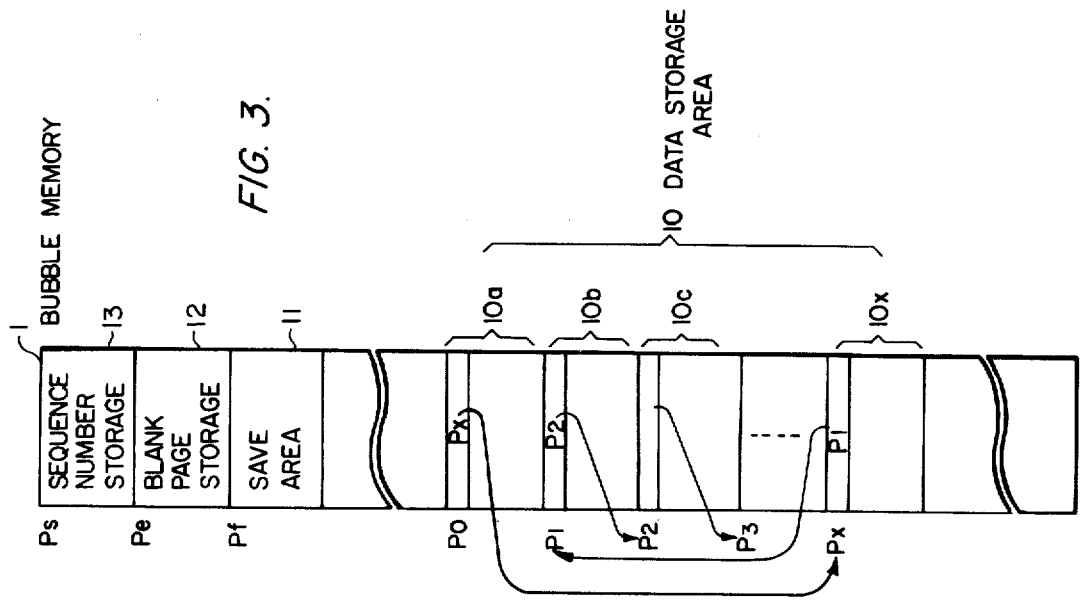
FIG. 3 is an illustrative view which is useful in describing the storage state in a magnetic bubble memory after a rewrite operation in accordance with an embodiment of the present invention.
Figure 2:
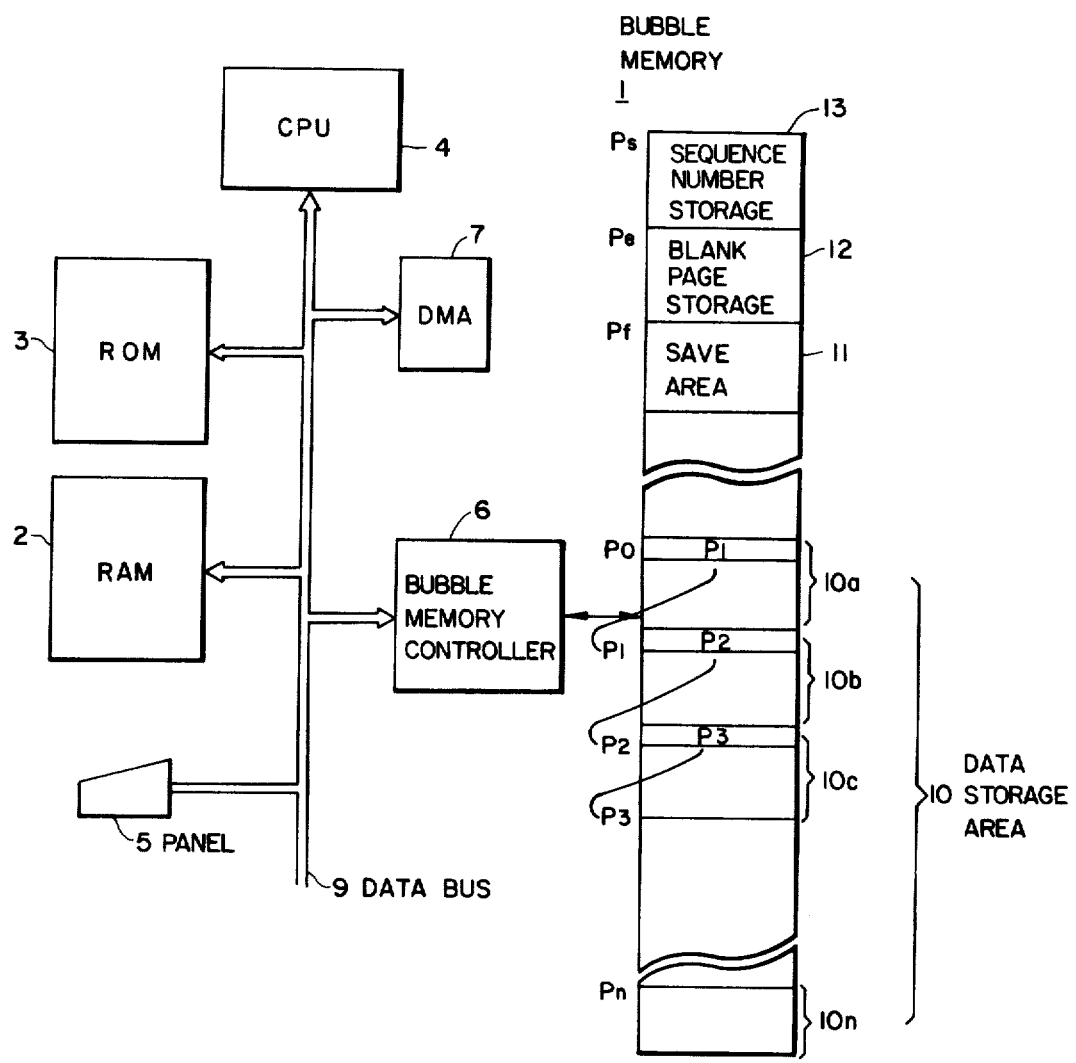
FIG. 2 is a block diagram which illustrates an embodiment of the system of the present invention.

Reference will now be had to FIG. 2 which shows a block diagram useful in describing a data rewrite system in accordance with the present invention, and to FIG. 3 which is an illustrative view useful in describing the storage state of a bubble memory after a rewrite operation in accordance with the present invention.

In FIGS. 2 and 3, a magnetic bubble memory for storing a program such as a machining program is designated at numeral 1. A data stroage area 10 is composed of page areas $10a, 10b, 10c, \ldots, 10n$ which store the machining program data divided into page units, the data being read and written in terms of page units. Stored also in the page areas $10a, 10b, 10c, \ldots, 10n$ are page addresses (pointers) of the page areas from which data is to be read out next. For example, the page addresses of the page areas $10a, 10b, 10c, \ldots, 10n$ are $P_0, P_1, P_2 \ldots$ and so forth. If the stored machining data is to be read out from the memory in the order of the page areas $10a, 10b, 10c, \ldots, 10n$, then the page address $P_1$ will be stored in page area $10a$, the page address $P_2$ will be stored in page area $10b$ and so on in regular order. Numeral 11 denotes a save area in which, in the rewriting of data stored in a given page area, the data is stored temporarily in advance of the erase cycle described above. Numeral 12 denotes a blank page storage area for storing blank page information (the corresponding relationship between a page address Pi and a blank page). Logical "0" is written in the blank page storage area 12 if there is no information such as machining data written in a page area corresponding to a page address $P_i$ ($i=0, 1, 2 \ldots$), but logical "1" is written in the blank page storage area 12 if information such as the machining data has been written in said page area. Numeral 13 denotes a sequence number storage area for storing the corresponding relationship between a page address and a sequence number. Finally, the page addresses of the save area, blank page storage area and sequence number storage area are $P_f$, $P_e$ and $P_s$, respectively.

A memory 2 comprises a random access memory RAM and is adapted to store the data of the page unit read from the magnetic bubble memory 1, the modification information, the sequence number indicative of the block which is to be modified, and other forms of data. A read-only control program memory 3 stores the control program. A processor 4, such as a microprocessor, responds to control program and machining program instructions so as to execute an editing process such as a prescribed rewrite operation, as well as a numerical control process. Numeral 5 denotes the operation panel of the numerical control unit, the panel having a manual data input switch MDI which is employed to enter modification data. Specifically, the operation panel 5 is used to enter such information as the sequence number $SN_i$ indicative of the block which is to be altered, the new numerical control data, and such information as is indicative of deletions, additions and revisions, and is employed to transfer this information to the memory 2 where it is stored. A bubble memory controller 6 reads data from the magnetic bubble memory 1, and writes data in the bubble memory 1, on a page-by-page basis in accordance with instructions from the processor 4. The instructions which the processor 4 sends to the bubble memory controller 6 consists of (a) the lead page address of the page area which is to be subjected to a read or write operation, (b) the number of pages which are to be read or written, and (c) such information as is indicative of the distinction between read and write. A direct memory access controller (DMAC) 7 responds to instructions from the processor 4 to transfer data, which has been read out from the memory 2, to the bubble memory 1 through the bubble memory controller 6, and to transfer to the memory 2 data which has been read out from the bubble memory 1 through the bubble memory controller 6. More specifically, when data is to be read out from the memory 2 and transferred to the magnetic bubble memory 1, the processor 4 supplies the DMAC 7 with an instruction indicative of the number of bytes which are to be read out from the memory 2, and the lead address of that location of the memory 2 from which the data is to be read. The DMAC 7 responds by reading out the data successively from the lead address of the memory 2 byte-by-byte, and by transferring this data to the bubble memory controller 6 which takes this data and writes it in the prescribed page area of the bubble memory 1. On the other hand, when the data read out from the bubble memory 1 via the bubble memory controller 6 is to be transferred to and stored in the memory 2, the processor 4 supplies the DMAC 7 with an instruction indicative of the total number of bytes of data to be written in the memory 2, and indicative of the lead address of the location in which the data is to be written. Thus, data obtained from the bubble memory controller 6 is written in memory 2 byte-by-byte. Finally, numeral 9 denotes a common bus.

In describing the operation, it will be assumed that a block of information having the sequence number $SN_i$ in the machining program will be rewritten. Modification information (such as the sequence number $SN_i$, new block information and a revision instruction) is entered using the operation panel 5 which is also employed to start the editing (rewriting) process. When this instruction is delivered, the processor (referred to hereinafter as a CPU) 4 is placed under the control of the rewrite process program which has been stored in the control program memory 3.

In operation, the CPU 4 instructs the bubble memory controller 6 of the lead page address $P_s$ of the sequence number storage area 13, as well as of the number of pages, and at the same time instructs the DMAC 7 of the lead address of that location of the memory 2 into which the data read out from the bubble memory 1 is to be planted or written, and of the total number of bytes. The bubble memory controller 6 reads serially, in page units, the contents stored in the sequence number storage area 13 identified by the page address $P_s$, delimiting this data into byte units. The bubble memory controller 6 sends a request to the DMAC 7 at the same time. The DMAC 7, in response to the request, causes the data, which has been read out via the bubble memory controller 6, to be stored in the memory 2 successively byte-by-byte from the designated lead address of the memory. Next, using this correspondence table between the read-out page address and the sequence number, the CPU 4 retrieves the page address of the location which stores the sequence number $SN_i$ entered by the operation panel 5. Upon retrieving the page address the CPU 4 instructs the bubble memory controller 6 of the page address and number of pages, and instructs the DMAC 7 of the lead address of that location of the memory 2 into which the data read out from the bubble memory 1 is to be planted, and of the total number of bytes. It will be assumed that information of two blocks having sequence numbers $SN_i$, $SN_{i+1}$ has been stored at the page address $P_o$ of the bubble memory 1. Thereafter, machining data is read out from page area 10a at the page address $P_o$ through the same read procedure as described in connection with the correspondence table, and the data is then written in the memory 2. After this has been executed the CPU 4 instructs the bubble memory controller 6 of the page address $P_f$ of the save area 11, and of the number of bytes which will be written therein, and at the same time instructs the DMAC 7 of the number of bytes which are to be read from the memory 2, and of the lead address of the location which stores the machining data read out from the page area 10a. In this manner the machining data which has been read out from the page area 10a and stored in the memory 2 is taken out of the memory 2 and then written in the save area 11 in an order which is opposite to that of the read operation. In other words, the foregoing operation takes the data stored in the page area 10a and places it in the save area 11 where it will be preserved.

The CPU 4, after completion of the process which preserves the data taken from the page area 10a, executes the destructive read of the data stored in the page area 10a of the bubble memory by the erase cycle described above in connection with FIG. 1, thereby to erase the data. At the same time, the CPU 4 employs the abovesaid machining data, new block information and the like, stored in memory 2, to execute an operation in the order /$SN_i$ block information/, /$SN_{i+1}$ new block information/, thereby forming new machining data. If all of this information can be stored in one page of the bubble memory 1, then the CPU 4 instructs the bubble memory controller 6 of the page address $P_o$ of the page area 10a and of the total number of bytes to be written therein, and instructs the DMAC 7 of the total number of bytes which are to be read from the memory 2, and of the lead address of the location which stores the edited new machining data mentioned above, whereby the new machining data in written in the page area 10a. This is the write cycle described earlier.

If the total quantity of information, namely the /$SN_i$ block information/ and the /$SN_{i+1}$ block information/, is greater than the storage capacity of one page, this information is divided into two portions, by way of example, and one portion must be written in the page area 10a, and the other portion in another page area which is blank. Accordingly, the CPU 4 first reads out, and sends to the memory 2, the blank page information from the blank page storage area 12, thereby to retrieve a blank page, this being accomplished through the bubble memory controller 6 and the DMAC 7. It will be assumed that the page address of the retrieved blank page is $P_x$. The CPU 4 then executes an editing process which comprises: forming first machining data which consists of the /page address $P_o$/, /$SN_i$ block information/, and a /portion of the $SN_{i+1}$ new block information/; forming second machining data which consists of the /page address $P_x$/ and the /remaining portion of the $SN_{i+1}$ new block information/; and writing the first machining data in the page area 10a of the bubble memory 1 and the second machining data in the page area 10x at the page address $P_x$ of the bubble memory, these write operations being executed through the erase and write cycles described above. The write operations can be understood more clearly if reference is made to FIG. 3. When the writing of the foregoing information has been carried out, the blank page information is updated, and the updated new blank page information is written in the blank page area 12. If the operation is executed in this manner, the rewrite process will be complete.

It is important to note here that the data which was stored in the page area 10a prior to the rewrite process will, without fail, remain in the page area 10a or be stored in the save area 11, and will therefore never be erased, even if an interruption in electric power should occur during the abovesaid rewrite process. For example, if a power interruption should take place before the information stored in page area 10a is taken out and preserved in the save area 11, then that information will remain in the page area 10a. On the other hand, if a power interruption should occur after the information stored in page area 10a has been taken out and preserved in the save area 11, but before the write cycle of the rewrite process has been completed, then that information will remain in the save area 11. Thus, through a later described restoration process which is executed when power is restored after the interruption, the information stored in the save area 11 may be restored to the page area 10a.

It should be noted, that the application of the present invention is not limited to the rewriting of block information as described above but that it is applicable also to the rewriting of pages which store such parameters as tool length, the degree of cutter offset, the degree of backlash, etc.

The restoration process alluded to above proceeds as follows, described in connection with FIG. 2.

In a numerical control unit, such parameters as rapid-feed speed, acceleration-deceleration time, tool length and degree of cutter offset are stored beforehand in the magnetic bubble memory 1 together with the machining program. Let it now be assumed that the degree of cutter offset is to be rewritten, but that an interruption in power occurs after the completion of the erase cycle of the rewrite process and before the completion of the write cycle of the rewrite process. In such an event the contents of the page area 10a which stores the degree of cutter offset is erased and therefore reduced to all "0s". The operator, however, does not know whether the page area 10a has a content of all "0s" or not. To make this determination the operator reads the contents of the page areas 12, 13, 10a, 10b, 10c... successively upon the restoration of power after the power source switch is closed, or before a machining operation or the like is initiated, and checks whether any of the page areas has a content of all "0s", which content is taken as a forbidden pattern. If the forbidden pattern is detected in this manner, then the information stored in the save area 11 is written in the page area whose content was read as the forbidden pattern. This procedure restores the old information to that particular page.

The immediately foregoing process will be described further with reference to FIG. 2. The CPU 4, after the power source has been turned on, or prior to the initiation of a machining operation or the like, responds to the control program to first read out the contents of the lead page area 10a of bubble memory 1, and write the contents in memory 2, through the bubble memory controller 6 and the DMAC 7. After this has been achieved, memory 2 is examined to determine whether its content coincides with the forbidden pattern; if not, the data stored in the bubble memory 1 continues to be read out successively from the page areas 10b, 10c... and written in memory 2 where it undergoes the check for the forbidden pattern in the manner described. If coincidence with the forbidden pattern is found with respect to the information read out from page area 10i at the page address $P_i$, the information preserved in the save area 11 is read out from the bubble memory and written in the memory 2, and then written in the page area 10i at the page address $P_i$ to complete the restoration process.

While the restoration process described above relates to the preservation in the save area of the old information prior to the modification, it is also possible to preserve new information, which follows a modification, in the save area 11. In addition, the size of the save area is not limited to one access unit, i.e., one page, but may have a capacity of several pages so that if the quantity of information to be rewritten extends over several pages, all of the old or new information can be saved in the save area. The forbidden pattern, moreover, need not necessarily be the all "0s" bit pattern, for a bit pattern which is different from the original pattern after the erasure step may serve as the forbidden pattern.

Though the present invention has been illustrated and described in connection with an embodiment applied to a magnetic bubble memory having a read-only major line and a write-only major line, it is obvious that the present invention is applicable to other non-volatile memories in which a rewrite process is carried out through erase and write cycles.

It should be evident from the foregoing description that the present invention prevents the erasure of stored data even if an interruption in power occurs during a rewrite process, and that this in turn precludes erroneous equipment operation. This can be accomplished with an inexpensive system since there is no requirement for highcost equipment adapted to supply power for a long period of time upon the interruption of the commercial power supply.

As many apparently widely different embodiments of the present invention can be made without departing from the spirit and scope thereof, it is to be understood that the invention is not limited to the specific embodiment thereof except as defined in the appended claims.

What we claim is:

1. A data rewrite system, operatively connected to received external modification data, for a non-volatile bubble memory having a bubble memory data storage area for storing first data and a bubble memory save area, and including a predetermined pattern, for writing second data in place of the first data stored in the data storage area, the system comprising:

a memory controller, operatively connected to the non-volatile bubble memory, for performing read and write operations in the non-volatile bubble memory;

a volatile memory, operatively connected to said non-volatile bubble memory, for storing the first data which is read from said non-volatile bubble memory and the second data which is written into said non-volatile bubble memory;

control means, operatively connected to said memory controller, for controlling said memory controller so as to written the first data into the bubble memory save area and erase the second data in the bubble memory data storage area, after a power interruption, said control means comprising:

a direct memory access controller, operatively connected to said memory controller and said volatile memory, for controlling the first and second data transfer between said memory controller and said volatile memory by reading the first data from the bubble memory data storage area, transferring the first data to said volatile memory and writing the first data in said volatile memory into said bubble memory save area;

a processor, operatively connected to said direct access controller and operatively connected to receive the external modification data, for controlling said direct memory access controller by determining whether the first data in the bubble memory data storage area corresponds to the predetermined pattern and if so, the first data is written into the bubble memory save area, and for forming and storing the second data in said volatile memory to be written into the bubble memory data storage area in dependence upon the external modification data.

2. A system according to claim 1, wherein the predetermined pattern is the same as the data in said volatile memory after power interruption.

* * * * *